United States Patent
Lee et al.

(10) Patent No.: US 11,175,313 B1
(45) Date of Patent: Nov. 16, 2021

(54) THIN-FILM PROBE CARD AND TEST MODULE THEREOF

(71) Applicant: CHUNGHWA PRECISION TEST TECH. CO., LTD., Taoyuan (TW)

(72) Inventors: Wen-Tsung Lee, New Taipei (TW); Hsun-Tai Wei, Taoyuan (TW); Kai-Chieh Hsieh, Taoyuan (TW); Chao-Chiang Liu, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 0 days.

(21) Appl. No.: 17/020,833

(22) Filed: Sep. 15, 2020

(30) Foreign Application Priority Data

May 11, 2020 (TW) .................................. 109115565

(51) Int. Cl.
*G01R 1/073* (2006.01)
(52) U.S. Cl.
CPC ....... *G01R 1/07378* (2013.01); *G01R 1/0735* (2013.01)

(58) Field of Classification Search
CPC .......................... G01R 1/07378; G01R 1/0735
See application file for complete search history.

(56) References Cited

U.S. PATENT DOCUMENTS

2017/0074902 A1* 3/2017 Nagata ............... G01R 31/2889
2019/0187178 A1* 6/2019 Nagata ............... G01R 1/07371

* cited by examiner

*Primary Examiner* — Paresh Patel
(74) *Attorney, Agent, or Firm* — Li & Cai Intellectual Property Office

(57) ABSTRACT

A thin-film probe card and a test module thereof are provided. The test module includes a carrying unit, a plurality of vertical probes fixed in position by the carrying unit, an elastic cushion disposed on the carrying unit, and a thin sheet. The thin sheet includes a carrier partially disposed on the elastic cushion, a plurality of signal circuits disposed on the carrier, and a plurality of electrically conductive protrusions that are respectively formed on the signal circuits. An end of the vertical probes is arranged at an inner side of the electrically conductive protrusions and is coplanar with free ends of the electrically conductive protrusions.

10 Claims, 9 Drawing Sheets

THIN-FILM PROBE CARD AND TEST MODULE THEREOF

CROSS-REFERENCE TO RELATED PATENT APPLICATION

This application claims the benefit of priority to Taiwan Patent Application No. 109115565, filed on May 11, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a thin-film probe card and a test module thereof.

BACKGROUND OF THE DISCLOSURE

A conventional thin-film probe card has a plurality of electrically conductive protrusions in a ring-shaped arrangement for abutting against and testing a device under test (DUT), so that the conventional thin-film probe card is only used to test a DUT in peripheral mode, and cannot be used to test a DUT in array mode.

SUMMARY OF THE DISCLOSURE

In response to the above-referenced technical inadequacies, the present disclosure provides a thin-film probe card and a test module thereof to effectively improve on the issues associated with conventional thin-film probe cards.

In one aspect, the present disclosure provides a thin-film probe card, which includes a space transformer, a carrying unit disposed on the space transformer, a plurality of vertical probes fixed in position by the carrying unit, an elastic cushion disposed on the carrying unit, and a thin sheet. Each of the vertical probes has a first end and a second end that is opposite to the first end. The carrying unit is sandwiched between the elastic cushion and the space transformer. The thin sheet defining an outer region, an inner region spaced apart from the outer region along a height direction, and an extension region that is connected to the outer region and the inner region. The thin sheet includes a carrier, a plurality of signal circuits disposed on the carrier, and a plurality of electrically conductive protrusions that are arranged in the inner region and that are respectively formed on the signal circuits. The carrier has a first portion and a second portion. The first portion is arranged in the inner region and is at least partially disposed on the elastic cushion, and the second portion is arranged in the outer region and is at least partially disposed on the space transformer. At least one of the signal circuits is electrically coupled to the space transformer. The electrically conductive protrusions are in a ring-shaped arrangement. The first ends of the vertical probes are arranged at an inner side of the electrically conductive protrusions and are coplanar with free ends of the electrically conductive protrusions, and the second ends of the vertical probes are connected to and are electrically coupled to the space transformer.

In another aspect, the present disclosure provides a test module of a thin-film probe card, which includes a carrying unit, a plurality of vertical probes fixed in position by the carrying unit, an elastic cushion disposed on the carrying unit, and a thin sheet. Each of the vertical probes has a first end and a second end that is opposite to the first end. The thin sheet defines an outer region, an inner region spaced apart from the outer region along a height direction, and an extension region that is connected to the outer region and the inner region. The thin sheet includes a carrier, a plurality of signal circuits disposed on the carrier, and a plurality of electrically conductive protrusions that are arranged in the inner region and that are respectively formed on the signal circuits. The carrier has a first portion that is arranged in the inner region and that is at least partially disposed on the elastic cushion. The electrically conductive protrusions are in a ring-shaped arrangement. The first ends of the vertical probes are arranged at an inner side of the electrically conductive protrusions and are coplanar with free ends of the electrically conductive protrusions.

Therefore, by virtue of "the thin-film probe card" and "the test module" in the present disclosure, the electrically conductive protrusions of the thin sheet and the vertical probes can jointly form a test point array, thereby broadening the range of applications and test objects of the thin-film probe card.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
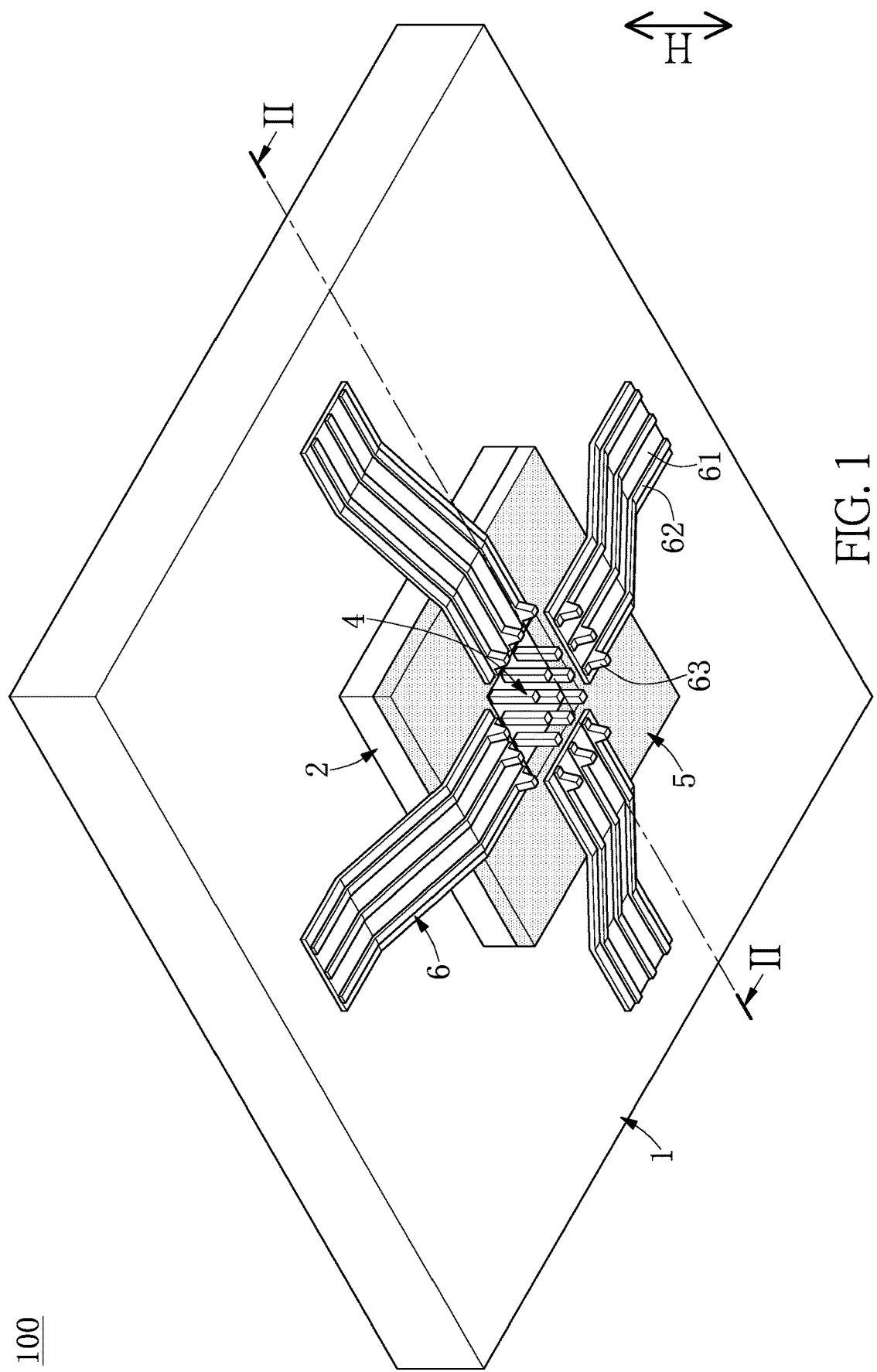
FIG. 1 is a perspective view of a thin-film probe card according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
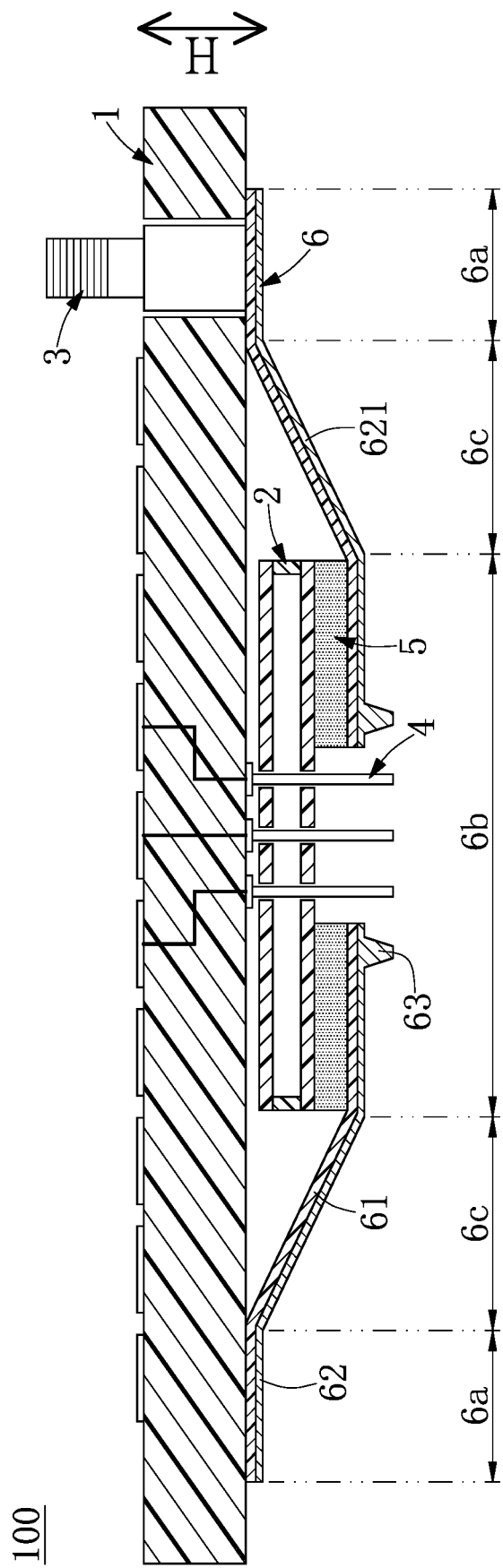
FIG. 2 is a cross-sectional view taken along line II-II of FIG. 1.

Referring to FIG. 1 and FIG. 2, a first embodiment of the present disclosure provides a thin-film probe card 100. The thin-film probe card 100 includes a space transformer 1, a carrying unit 2 disposed on the space transformer 1, at least one coaxial connector 3 fastened to the space transformer 1, a plurality of vertical probes 4 fixed in position by the carrying unit 2, an elastic cushion 5 disposed on the carrying unit 2, and a thin sheet 6 that is partially disposed on the elastic cushion 5. The carrying unit 2, the vertical probes 4, the elastic cushion 5, and the thin sheet 6 in the present embodiment can be jointly defined as a test module, and the test module can be independently used (e.g., sold) or can be used in cooperation with other components.

The carrying unit 2 in the present embodiment is disposed on a substantially central portion of the space transformer 1, and the at least one coaxial connector 3 is arranged at an outer side of the carrying unit 2. According to design requirements, the at least one coaxial connector 3 can be fastened to the space transformer 1 by passing through the space transformer 1 or being disposed on a board surface of the space transformer 1.

Moreover, the carrying unit 2 in the present embodiment is a guide board assembly (e.g., the guide board assembly includes an upper die, a lower die, and a spacer that is sandwiched between the upper die and the lower die), but the present disclosure is not limited thereto. In addition, the structure of the vertical probe 4 and the structure of the carrying unit 2 can be adjusted or changed according to design requirements, and are not limited to the present embodiment.

Based on the material or the structural design of the elastic cushion 5, the elastic cushion 5 can be elastically deformable after being pressed. Moreover, the elastic cushion 5 in the present embodiment can be made of an insulative and resilient material (e.g., silicone), but the present disclosure is not limited thereto. The elastic cushion 5 is disposed on the carrying unit 2, and outer lateral surfaces of the elastic cushion 5 in the present embodiment are respectively flush with outer lateral surfaces of the carrying unit 2. In other words, the carrying unit 2 is sandwiched between the elastic cushion 5 and the space transformer 1. Moreover, the elastic cushion 5 in the present embodiment is in a ring-shape, and the vertical probes 4 are inserted into an inner side of the elastic cushion 5.

The thin sheet 6 defines an outer region 6a, an inner region 6b spaced apart from the outer region 6a along a height direction H, and an extension region 6c that is connected to the outer region 6a and the inner region 6b. In the present embodiment, the size and the position of the inner region 6b correspond to those of the elastic cushion 5, and the extension region 6c is obliquely connected to the outer region 6a and the inner region 6b.

The thin sheet 6 includes a sheet-like carrier 61, a plurality of signal circuits 62 disposed on the carrier 61, and a plurality of electrically conductive protrusions 63 that are respectively disposed on the signal circuits 62. The carrier 61 is preferably made of an insulative material, and has a first portion (e.g., the inner portion of the carrier 61 shown in FIG. 2) and a second portion (e.g., the outer portion of the carrier 61 shown in FIG. 2) that is opposite to the first portion. Specifically, the first portion of the carrier 61 is arranged in the inner region 6b and is at least partially disposed on the elastic cushion 5, and the second portion of the carrier 61 is arranged in the outer region 6a and is at least partially disposed on the space transformer 1.

The signal circuits 62 are formed on the carrier 61, and each of the signal circuits 62 in the present embodiment extends from the outer region 6a to the inner region 6b and can be in a straight shape or an irregular shape, but the present disclosure is not limited thereto.

The signal circuits 62 of the thin sheet 6 in the present embodiment have at least one high-frequency signal circuit 621, and a portion of the at least one high-frequency signal circuit 621 arranged in the outer region 6a is connected to the at least one coaxial connector 3, so that the thin-film probe card 100 can be used to stably and precisely transmit a high-frequency signal by the at least one high-frequency signal circuit 621 and the at least one coaxial connector 3. Moreover, according to design requirements, the at least one coaxial connector 3 can be perpendicularly connected to the at least one high-frequency signal circuit 621 (as shown in FIG. 2) or can be connected to the at least one high-frequency signal circuit 621 along other directions (not shown in figures).

Moreover, at least one of the signal circuits 62 is electrically coupled to the space transformer 1. In the present embodiment, the quantity of the signal circuits 62 electrically coupled to the space transformer 1 is more than one, and the signal circuits 62 of the thin sheet 6 excluding the at least one high-frequency signal circuit 621 are electrically coupled to the space transformer 1. The electrically coupling manner between the space transformer 1 and at least one of the signal circuits 62 can be a soldering manner, a pressing connection manner, a manner implemented by a connector, or a manner implemented by a reed, but the present disclosure is not limited thereto.

The electrically conductive protrusions 63 are arranged in the inner region 6b and are in a ring-shaped arrangement. The electrically conductive protrusions 63 are respectively formed on the signal circuits 62. In the present embodiment, each of the electrically conductive protrusions 63 is integrally connected to the corresponding signal circuit 62. In other words, each of the electrically conductive protrusions 63 and the corresponding signal circuit 62 are made of the same material. Specifically, each of the electrically conductive protrusions 63 in the present embodiment is a tapered metal structure that can be in a conical shape, a pyramidical shape, a truncated cone shape, or a truncated pyramid shape, but the present disclosure is not limited thereto.

In addition, each of the vertical probes 4 has a first end (e.g., the bottom end shown in FIG. 2) and a second end (e.g., the top end shown in FIG. 2) that is opposite to the first end. The first ends of the vertical probes 4 are arranged at an inner side of the electrically conductive protrusions 63 and are coplanar with free ends of the electrically conductive protrusions 63, and the second ends of the vertical probes 4 are connected to and are electrically coupled to the space transformer 1.

Accordingly, the electrically conductive protrusions 63 of the thin sheet 6 and the vertical probes 4 can jointly form a test point array, thereby broadening the range of applications and test objects of the thin-film probe card 100.

Second Embodiment

Figure 3:
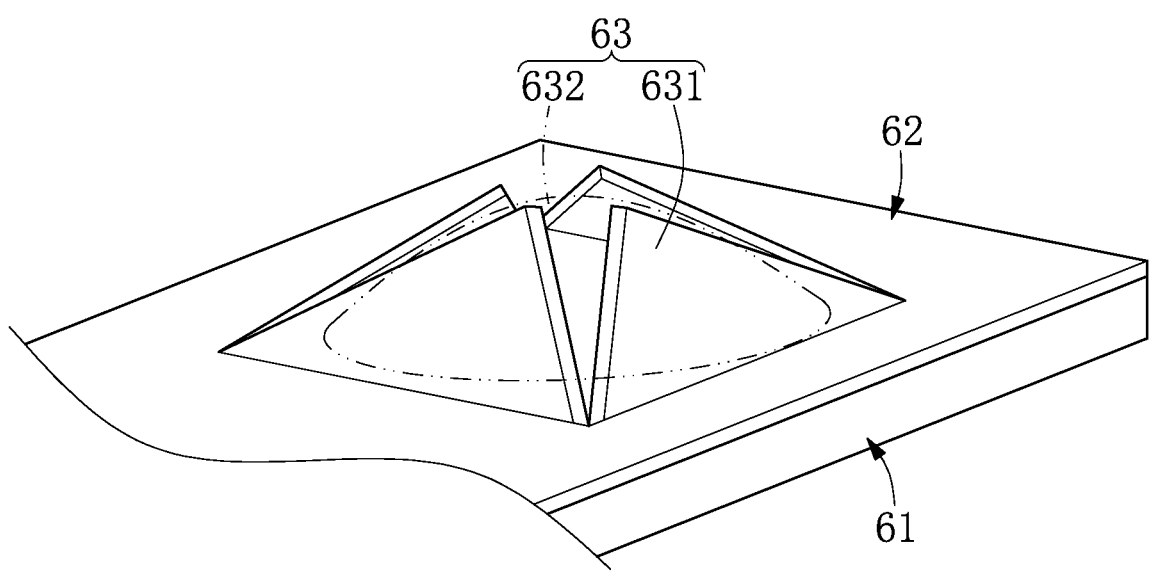
FIG. 3 is a perspective view showing a part (e.g., an electrically conductive protrusion and corresponding portions) of a thin sheet of a thin-film probe card according to a second embodiment of the present disclosure.

Referring to FIG. 3, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In the present embodiment, each of the electrically conductive protrusions 63 includes a claw-like metal structure 631 electrically coupled to the corresponding signal circuit 62 and an elastomer 632 (e.g., a silicone or a foam) that is arranged inside of the claw-like metal structure 631. In each of the electrically conductive protrusions 63, the claw-like metal structure 631 is elastically deformable by pressing onto the elastomer 632. Accordingly, the electrically conductive protrusions 63 can be firmly abutted against a DUT.

Third Embodiment

Referring to FIG. 4 to FIG. 9, a third embodiment of the present disclosure is similar to the first and second embodiments of the present disclosure. For the sake of brevity, descriptions of the same components in the first to third embodiments of the present disclosure will be omitted herein, and the following description only discloses different features between the first embodiment and the first and second embodiments.

Figure 4:
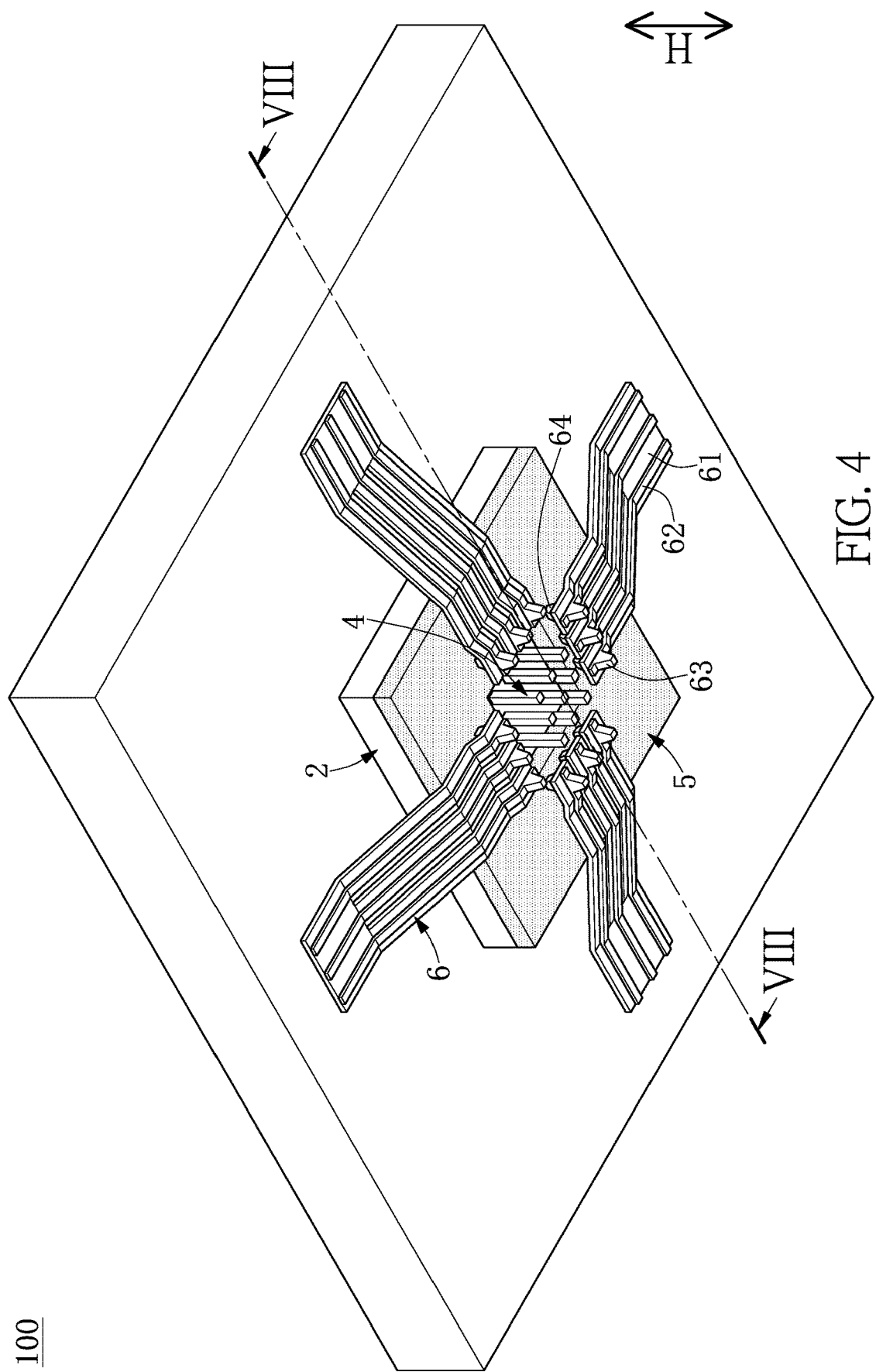
FIG. 4 is a perspective view of a thin-film probe card according to a third embodiment of the present disclosure.
Figure 5:
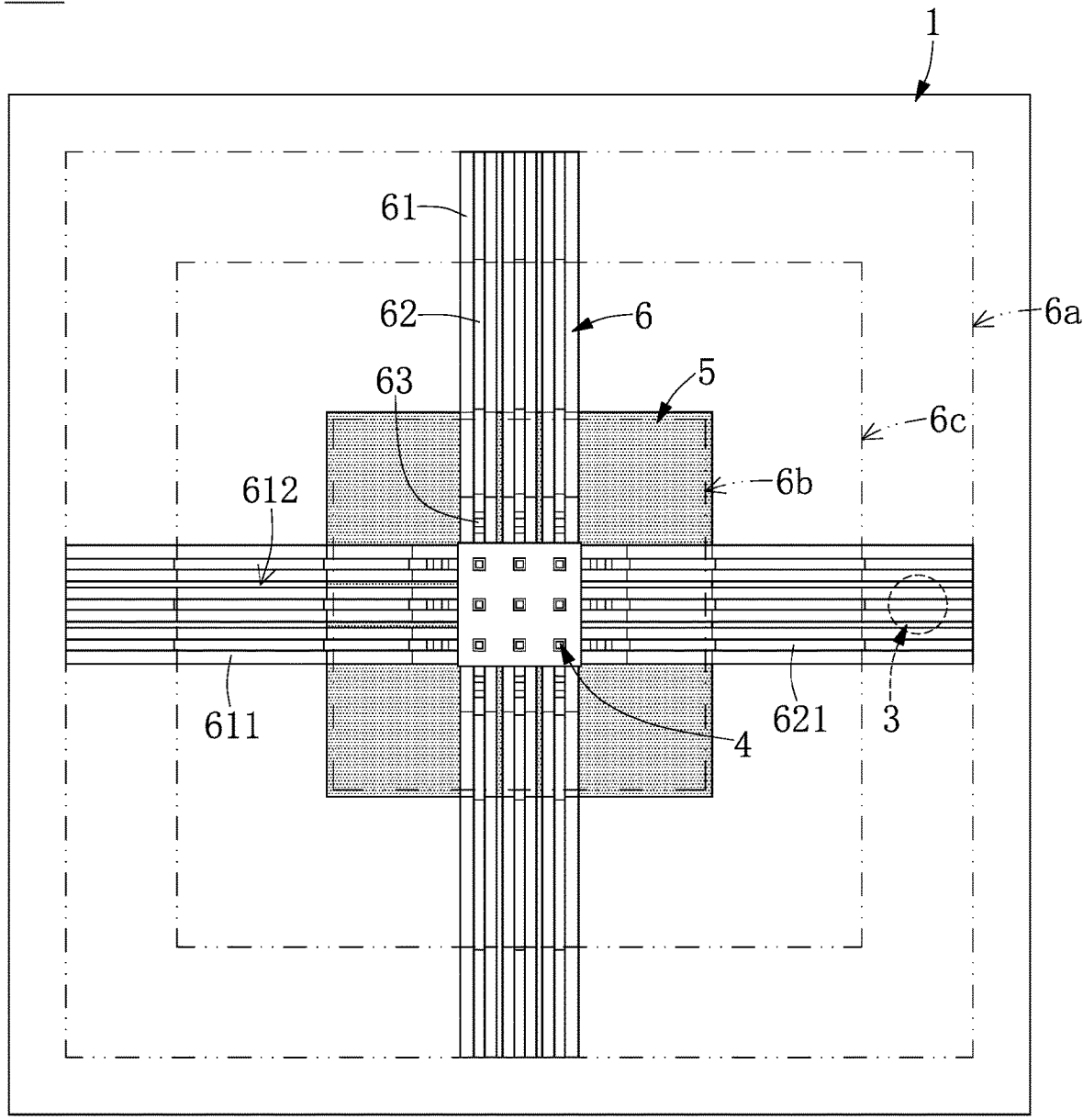
FIG. 5 is a top view of FIG. 4.

In the present embodiment, as shown in FIG. 4 and FIG. 5, the carrier 61 can be a single layer structure or a multi-layer structure according to design requirements. The first portion of the carrier 61 arranged in the inner region 6b has a plurality of grooves 612 so as to divide the first portion into a plurality of action segments 611. Specifically, each of the grooves 612 of the carrier 61 in the present embodiment extends from the inner region 6b to the extension region 6c. In other words, each of the action segments 611 is arranged in the inner region 6b and the extension region 6c, but the present disclosure is not limited thereto. For example, in other embodiments of the present disclosure, each of the grooves 612 of the carrier 61 can extend from the inner region 6b to the outer region 6a, so that each of the action segments 611 is arranged in the inner region 6b, the extension region 6c, and the outer region 6a.

Figure 6:
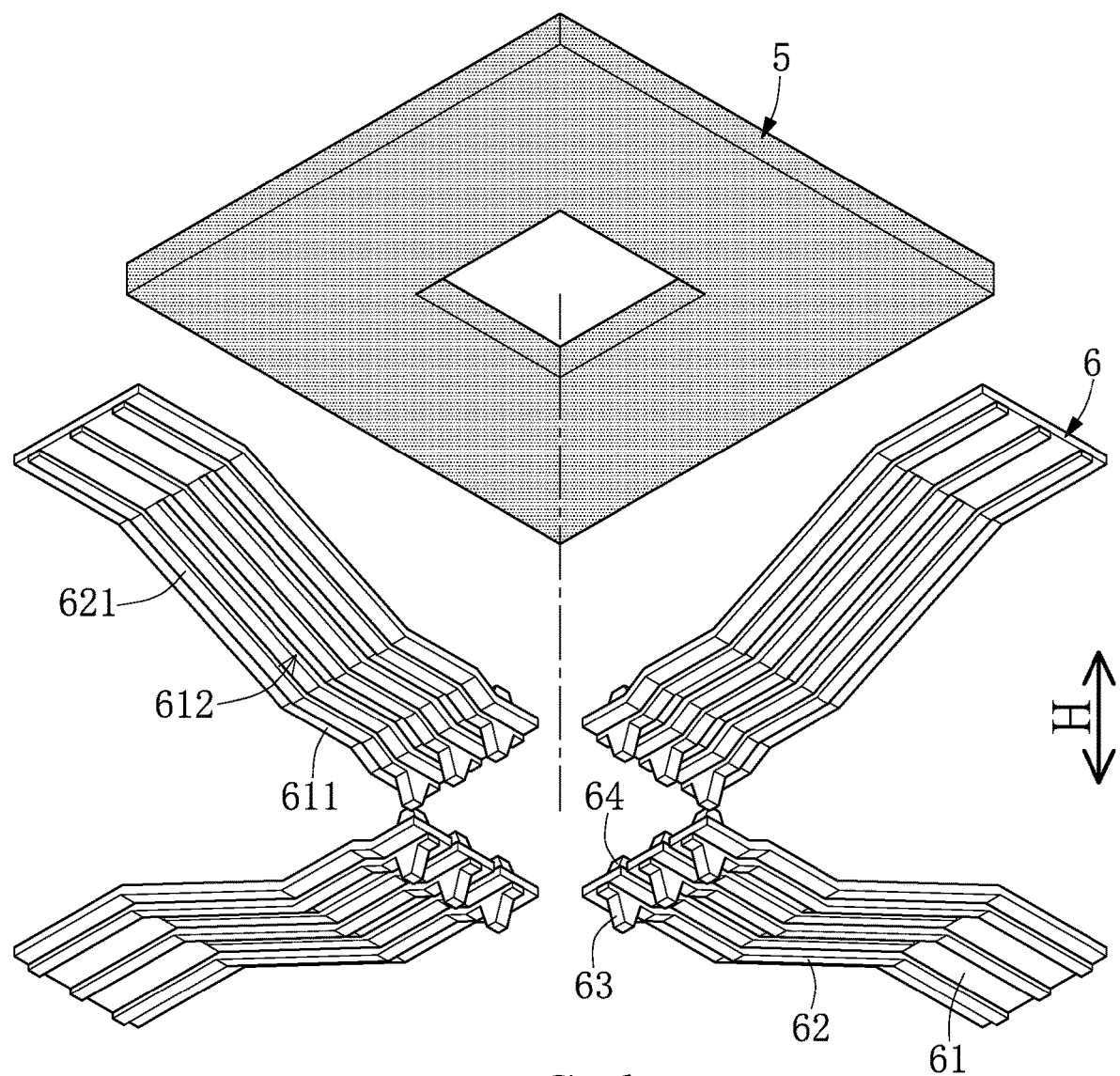
FIG. 6 is an exploded view showing an elastic cushion and a thin sheet of FIG. 4.
Figure 7:
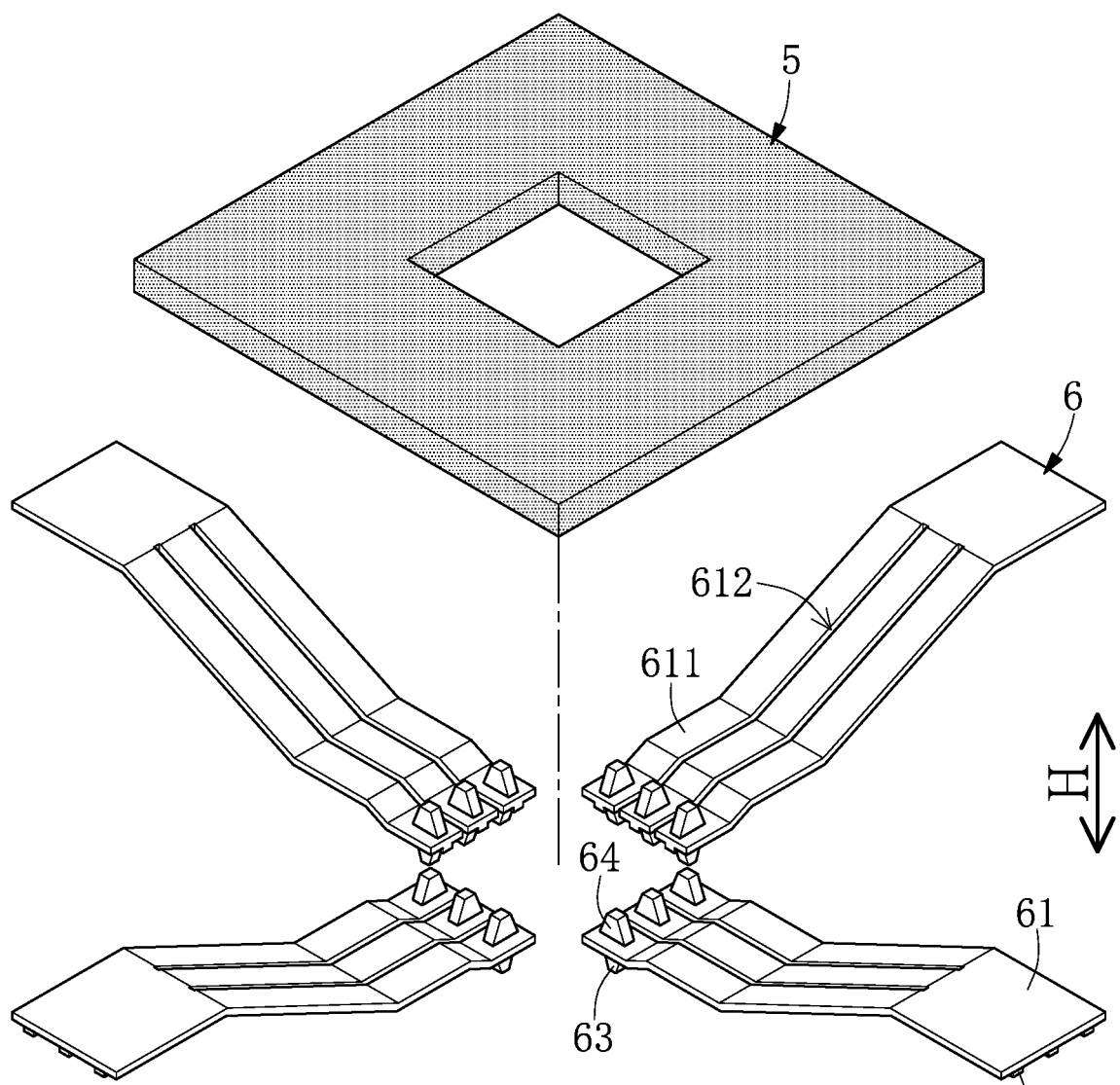
FIG. 7 is an exploded view showing the elastic cushion and the thin sheet of FIG. 4 from another angle of view.

Moreover, as shown in FIG. 5 to FIG. 7, portions of the signal circuits 62 arranged in the inner region 6b are respectively disposed on the action segments 611. Specifically, the portions of the signal circuits 62 arranged in the inner region 6b in the present embodiment are disposed one-to-one on the action segments 611, respectively, but the present disclosure is not limited thereto. For example, in other embodiments of the present disclosure, the portions of the signal circuits 62 arranged in the inner region 6b can be disposed many-to-one on the action segments 611, respectively.

The thin sheet 6 in the present embodiment includes a plurality of independent bumps 64 arranged between the action segments 611 and the elastic cushion 5, and the independent bumps 64 respectively correspond in position to the electrically conductive protrusions 63 along the height direction H, so that each of the action segments 611 is formed as a stepped structure. Moreover, the independent bumps 64 are separate from each other, and a surrounding lateral surface of each of the independent bumps 64 is exposed in air. In other words, the surrounding lateral surface of each of the independent bumps 64 and the corresponding action segment 611 have a gap G therebetween.

Specifically, the independent bump 64 can be made of an insulative material or an electrically conductive material (e.g., metal). In the present embodiment, the signal circuits 62, the electrically conductive protrusions 63, and the independent bumps 64 are preferably made of the same material, so that the thin sheet 6 can be manufactured easily. Moreover, the material of the independent bump 64 can be a copper that is exposed in air (e.g., the copper is covered by an antioxidant material), so that the independent bump 64 can be ensured to have a lower contact resistance during a test process of the thin-film probe card 100.

Figure 8:
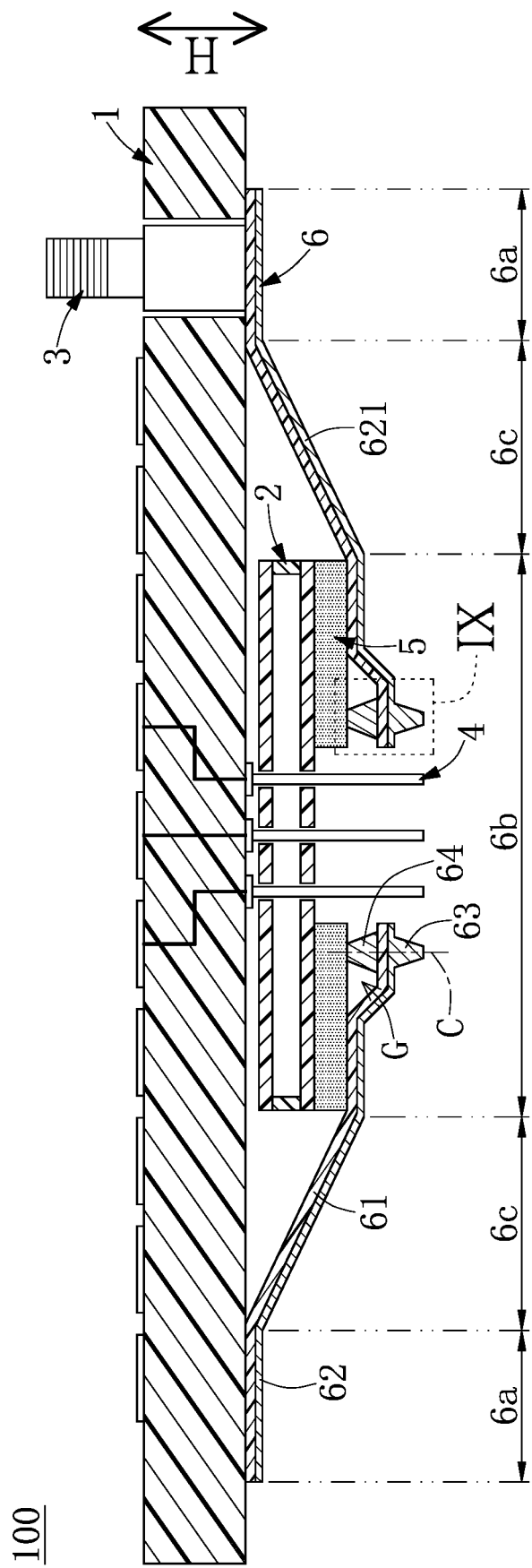
FIG. 8 is a cross-sectional view taken along line VIII-VIII of FIG. 4.
Figure 9:
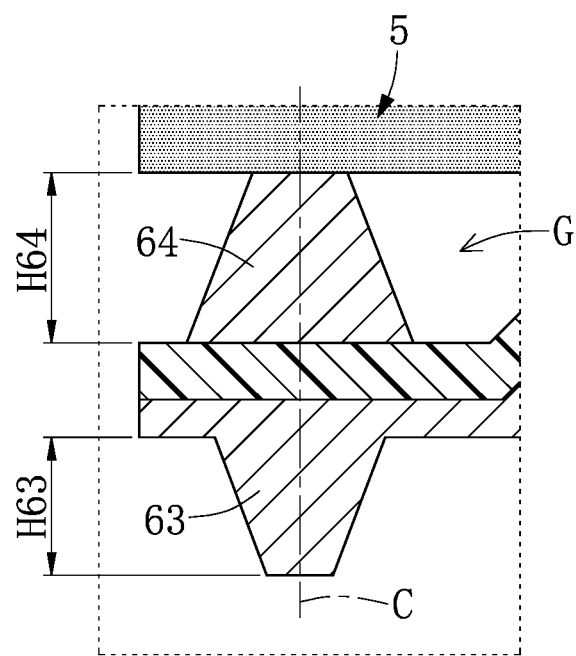
FIG. 9 is an enlarged view of portion IX of FIG. 8.

In addition, the independent bump 64 can be provided with at least one of the following features for improving the performance of the thin sheet 6, but the present disclosure is not limited thereto. As shown in FIG. 8 and FIG. 9, a central axis C of any one of the electrically conductive protrusions 63 is overlapped with a central axis C of the corresponding independent bump 64, and is parallel to the height direction H. Moreover, any one of the independent bumps 64 has a supporting thickness H64 in the height direction H, any one of the electrically conductive protrusions 63 has a protruding thickness H63 in the height direction H, and the supporting thickness H64 is greater than or equal to the protruding thickness H63 and is smaller than five times of the protruding thickness H63. In addition, when any one of the electrically conductive protrusions 63 and the corresponding independent bump 64 are orthogonally projected onto a plane along the height direction H, a projection region defined by the electrically conductive protrusion 63 is located in a projection region defined by the independent bump 64.

When any one of the electrically conductive protrusions 63 of the thin-film probe card 100 is pressed, the pressed electrically conductive protrusion 63 only presses the corresponding independent bump 64 through the corresponding signal circuit 62 and the corresponding action segment 611, so that a movement linkage of the electrically conductive protrusions 63 of the thin-film probe card 100 can be reduced. Accordingly, the electrically conductive protrusions 63 of the thin-film probe card 100 can be acted upon by a uniform force, and can be firmly abutted against metal pads of the DUT. Specifically, the test region (or the distribution of the electrically conductive protrusions 63) of the thin-film probe card 100 can be wider.

In conclusion, by virtue of "the thin-film probe card" and "the test module" in the present disclosure, the electrically conductive protrusions of the thin sheet and the vertical probes can jointly form a test point array, thereby broadening the range of applications and test objects of the thin-film probe card. Moreover, by virtue of "the thin-film probe card" in the present disclosure, the claw-like metal structure of each of the electrically conductive protrusions is elastically deformable by pressing onto the elastomer, so that the electrically conductive protrusions can be firmly abutted against a DUT.

In addition, by virtue of "the thin-film probe card" in the present disclosure, when any one of the electrically conductive protrusions of the thin-film probe card is pressed, the pressed electrically conductive protrusion only presses the corresponding independent bump through the corresponding signal circuit and the corresponding action segment, so that a movement linkage of the electrically conductive protrusions of the thin-film probe card can be reduced. Accordingly, the electrically conductive protrusions of the thin-film probe card can be acted upon by a uniform force, and can be firmly abutted against metal pads of the DUT. Specifically, the test region (or the distribution of the electrically conductive protrusions) of the thin-film probe card can be wider.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A thin-film probe card, comprising:
   a space transformer;
   a carrying unit disposed on the space transformer;
   a plurality of vertical probes fixed in position by the carrying unit, wherein each of the vertical probes has a first end and a second end that is opposite to the first end;
   an elastic cushion disposed on the carrying unit, wherein the carrying unit is sandwiched between the elastic cushion and the space transformer; and
   a thin sheet defining an outer region, an inner region spaced apart from the outer region along a height direction, and an extension region that is connected to the outer region and the inner region, wherein the thin sheet includes:
      a carrier having a first portion and a second portion, wherein the first portion is arranged in the inner region and is at least partially disposed on the elastic cushion, and the second portion is arranged in the outer region and is at least partially disposed on the space transformer;
      a plurality of signal circuits disposed on the carrier, wherein at least one of the signal circuits is electrically coupled to the space transformer; and
      a plurality of electrically conductive protrusions arranged in the inner region and respectively formed on the signal circuits, wherein the electrically conductive protrusions are in a ring-shaped arrangement, wherein the first ends of the vertical probes are arranged at an inner side of the electrically conductive protrusions and are coplanar with free ends of the electrically conductive protrusions, and the second ends of the vertical probes are connected to and are electrically coupled to the space transformer;
   wherein the first portion of the carrier arranged in the inner region has a plurality of grooves so as to divide the first portion into a plurality of action segments, and portions of the signal circuits arranged in the inner region are respectively disposed on the action segments, and wherein the thin sheet includes a plurality of independent bumps arranged between the action segments and the elastic cushion, and the independent bumps respectively correspond in position to the electrically conductive protrusions along the height direction, so that each of the action segments is formed as a stepped structure.

2. The thin-film probe card according to claim 1, wherein when any one of the electrically conductive protrusions and the corresponding independent bump are orthogonally projected onto a plane along the height direction, a projection region defined by the electrically conductive protrusion is located in a projection region defined by the independent bump.

3. The thin-film probe card according to claim 1, wherein a central axis of any one of the electrically conductive protrusions is overlapped with a central axis of the corresponding independent bump, and is parallel to the height direction.

4. The thin-film probe card according to claim 1, wherein any one of the independent bumps has a supporting thickness in the height direction, and any one of the electrically conductive protrusions has a protruding thickness in the height direction, and wherein the supporting thickness is greater than or equal to the protruding thickness, and is smaller than five times of the protruding thickness.

5. The thin-film probe card according to claim 1, wherein the signal circuits, the electrically conductive protrusions, and the independent bumps are made of the same material, and a surrounding lateral surface of each of the independent bumps is exposed in air.

6. The thin-film probe card according to claim 1, wherein each of the electrically conductive protrusions includes a claw-like metal structure electrically coupled to the corresponding signal circuit and an elastomer that is arranged inside of the claw-like metal structure, and wherein in each of the electrically conductive protrusions, the claw-like metal structure is elastically deformable by pressing onto the elastomer.

7. The thin-film probe card according to claim 1, further comprising at least one coaxial connector fastened to the space transformer, wherein the signal circuits of the thin sheet have at least one high-frequency signal circuit, and a portion of the at least one high-frequency signal circuit arranged in the outer region is connected to the at least one coaxial connector.

8. A test module of a thin-film probe card, comprising:
   a carrying unit;
   a plurality of vertical probes fixed in position by the carrying unit, wherein each of the vertical probes has a first end and a second end that is opposite to the first end;
   an elastic cushion disposed on the carrying unit; and
   a thin sheet defining an outer region, an inner region spaced apart from the outer region along a height direction, and an extension region that is connected to the outer region and the inner region, wherein the thin sheet includes:
- a carrier having a first portion that is arranged in the inner region and that is at least partially disposed on the elastic cushion;
- a plurality of signal circuits disposed on the carrier; and
- a plurality of electrically conductive protrusions arranged in the inner region and respectively formed on the signal circuits, wherein the electrically conductive protrusions are in a ring-shaped arrangement, wherein the first ends of the vertical probes are arranged at an inner side of the electrically conductive protrusions and are coplanar with free ends of the electrically conductive protrusions;

wherein the first portion of the carrier arranged in the inner region has a plurality of grooves so as to divide the first portion into a plurality of action segments, and portions of the signal circuits arranged in the inner region are respectively disposed on the action segments, wherein the thin sheet includes a plurality of independent bumps arranged between the action segments and the elastic cushion, and the independent bumps respectively correspond in position to the electrically conductive protrusions along the height direction, so that each of the action segments is formed as a stepped structure.

9. The test module according to claim 8, wherein a central axis of any one of the electrically conductive protrusions is overlapped with a central axis of the corresponding independent bump, and is parallel to the height direction, and wherein when any one of the electrically conductive protrusions and the corresponding independent bump are orthogonally projected onto a plane along the height direction, a projection region defined by the electrically conductive protrusion is located in a projection region defined by the independent bump.

10. A test module of a thin-film probe card, comprising:
- a carrying unit;
- a plurality of vertical probes fixed in position by the carrying unit, wherein each of the vertical probes has a first end and a second end that is opposite to the first end;
- an elastic cushion disposed on the carrying unit; and
- a thin sheet defining an outer region, an inner region spaced apart from the outer region along a height direction, and an extension region that is connected to the outer region and the inner region, wherein the thin sheet includes:
  - a carrier having a first portion that is arranged in the inner region and that is at least partially disposed on the elastic cushion;
  - a plurality of signal circuits disposed on the carrier; and
  - a plurality of electrically conductive protrusions arranged in the inner region and respectively formed on the signal circuits, wherein the electrically conductive protrusions are in a ring-shaped arrangement, wherein the first ends of the vertical probes are arranged at an inner side of the electrically conductive protrusions and are coplanar with free ends of the electrically conductive protrusions;

wherein each of the electrically conductive protrusions includes a claw-like metal structure electrically coupled to the corresponding signal circuit and an elastomer that is arranged inside of the claw-like metal structure, and wherein in each of the electrically conductive protrusions, the claw-like metal structure is elastically deformable by pressing onto the elastomer.

* * * * *